United States Patent
Peter et al.

(10) Patent No.: US 6,788,129 B2
(45) Date of Patent: Sep. 7, 2004

(54) INTEGRATED CIRCUIT HAVING A PROGRAMMABLE ELEMENT AND METHOD OF OPERATING THE CIRCUIT

(75) Inventors: Jörg Peter, Eresing (DE); Jürgen Lindolf, Friedberg (DE); Florian Schamberger, Bad Reichenhall (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/301,090

(22) Filed: Nov. 20, 2002

(65) Prior Publication Data

US 2003/0094996 A1 May 22, 2003

(30) Foreign Application Priority Data

Nov. 20, 2001 (DE) .......................................... 101 56 830

(51) Int. Cl.[7] .......................... H01H 37/76; H01H 85/00
(52) U.S. Cl. ......................................... 327/525; 327/526
(58) Field of Search ................................. 327/525, 526; 365/225.7

(56) References Cited

U.S. PATENT DOCUMENTS

| 4,730,129 A | | 3/1988 | Kunitoki et al. ............. 327/525 |
| 5,418,487 A | * | 5/1995 | Armstrong, II ............. 327/525 |
| 2002/0062473 A1 | * | 5/2002 | Tomioka ......................... 716/4 |

* cited by examiner

Primary Examiner—Terry D. Cunningham
Assistant Examiner—Quan Tra
(74) Attorney, Agent, or Firm—Laurence A. Greenberg; Werner H. Stemer; Ralph E. Locher

(57) ABSTRACT

An integrated circuit has a programmable element with an electrical interconnect resistance that can be varied by programming. An evaluation circuit for the evaluation of the electrical interconnect resistance is connected to the programmable element. The electrical interconnect resistance of the programmable element is read out and evaluated by the evaluation circuit. With a trimming circuit, connected to the evaluation circuit, an operating point of the evaluation circuit is adjusted in dependence on the electrical interconnect resistance that has been read out by the evaluation circuit. In this way, a state of the programmable element can be read out and evaluated largely independently of technological fluctuations.

6 Claims, 2 Drawing Sheets

INTEGRATED CIRCUIT HAVING A PROGRAMMABLE ELEMENT AND METHOD OF OPERATING THE CIRCUIT

BACKGROUND OF THE INVENTION

Field of the Invention

The invention lies in the integrated technology field. More specifically, the invention relates to an integrated circuit having a programmable element, in the case of which an electrical interconnect resistance can be varied by programming, and having an evaluation circuit, connected to the programmable element, for the evaluation of the electrical interconnect resistance. The invention also pertains to a method for operating the integrated circuit.

Integrated circuits often have redundancy circuits for repairing defective circuit sections. In the case of integrated memory circuits, in particular these may be, for example, regular word lines and bit lines with defective memory cells which are replaced by redundant word lines and bit lines, respectively. To that end, the integrated circuit is tested in a test operation and the redundant elements are subsequently programmed. To that end, a redundancy circuit has programmable elements, for example in the form of so-called fuses, which serve, for the case of repairing word lines or bit lines, for storing the address of a line to be replaced.

Such programmable elements are embodied for example in the form of electrically programmable fuses or laser fuses which have an electrical interconnect resistance which can be permanently varied by the programming. Electrically programmable fuses are programmable for example at the end of the integrated circuit fabrication process by application of a so-called blowing voltage. Laser fuses are generally programmed by bombardment with a laser beam.

A programmable element in the form of a fuse has an existing low-resistance electrical connection which is, as it were, severed by the programming (high-resistance interconnect resistance). An electrically programmable element in the form of a so-called antifuse has, in the non-programmed state, an interruption (high-resistance interconnect resistance) in a voltage path, which is put into a low-resistance state by a programming.

In order to read out and evaluate the state of a programmable element or the electrical interconnect resistance thereof, an evaluation circuit for reading out and evaluating the electrical interconnect resistance of the element is generally connected to the relevant programmable element. Such an evaluation circuit usually contains a read-out transistor, connected to the programmable element, and a volatile memory element in the form of a so-called fuse latch, connected to the read-out transistor.

During the evaluation of the state of the programmable element, the problem generally arises that the regions of the interconnect resistance which are to be used to evaluate the programmable element as programmed or as non-programmed are occasionally subjected to technological fluctuations. A programmable fuse or antifuse has a silicon nitride layer, for example, which is arranged between a metalization plane and a contact and can be varied in its electrical conductivity in accordance with the programming. With a construction of this type, technological fluctuations arise for example in the form of production-dictated variation of the thickness of the silicon nitride layer and/or a varying configuration of the electrodes above the silicon nitride layer. In order to be able to carry out an evaluation of the state of the programmable element, generally a respective resistance limit value is defined for the programmed state and non-programmed state. In this case, deviations from the respective resistance limit value on account of technical fluctuations can have the result that the state of the programmable elements is no longer evaluated entirely satisfactorily and reliably.

SUMMARY OF THE INVENTION

It is accordingly an object of the invention to provide an integrated circuit and an operating method which overcome the above-mentioned disadvantages of the heretofore-known devices and methods of this general type and which provide for an integrated circuit having a programmable element wherein a state of the programmable element can be read out and evaluated reliably to a large extent. Furthermore, it is an object of the present invention to provide a method for operating such an integrated circuit.

With the foregoing and other objects in view there is provided, in accordance with the invention, an integrated circuit, comprising:

a programmable element having an electrical interconnect resistance variable by programming;

an evaluation circuit, connected to the programmable element, for evaluating the electrical interconnect resistance of the programmable element; and a trimming circuit, connected to the evaluation circuit, for variably setting an operating point of the evaluation circuit in an operation of the integrated circuit.

With the above and other objects in view there is also provided, in accordance with the invention, a method of operating the above-outlined integrated circuit. The method comprises the following steps:

reading out an electrical interconnect resistance of the programmable element and evaluating the electrical interconnect resistance with the evaluation circuit; and adjusting an operating point of the evaluation circuit with the trimming circuit in dependence on the electrical interconnect resistance obtained in the reading out step.

In other words, the integrated circuit according to the invention has a trimming circuit, connected to the evaluation circuit for the evaluation of the electrical interconnect resistance of the programmable element, the trimming circuit serving for the variable setting of an operating point of the evaluation circuit in an operation of the integrated circuit. As a result, to a certain extent, it is possible to compensate for technological fluctuations of the electrical interconnect resistance in the programmed state or in the non-programmed state of the programmable element, in particular during a test operation.

To that end, in accordance with the method according to the invention, for example in a test operation of the integrated circuit, the electrical interconnect resistance of the programmable element is read out and evaluated by the evaluation circuit. With the trimming circuit, an operating point of the evaluation circuit is adjusted in a manner dependent on the read-out value of the electrical interconnect resistance. Consequently, the operating ranges of the programmable element and of the evaluation circuit can be coordinated with one another in such a way that a largely reliable read-out and evaluation of the programmable element is made possible in a later normal operation of the integrated circuit.

In accordance with an added feature of the invention, the evaluation circuit has a read-out transistor, connected to the programmable element. In this case, the trimming circuit serves for the variable setting of a control voltage at a control terminal of the read-out transistor. With the variable setting of the control voltage at the control terminal of the read-out transistor, the operating range thereof can be set and adapted with regard to the state of the programmable element. For this purpose, the trimming circuit is provided in particular for controlling a voltage generator, connected to the control terminal of the read-out transistor, and is connected thereto.

In accordance with an additional feature of the invention, the evaluation circuit has a terminal for the external read-out of the electrical interconnect resistance of the programmable element. As a result, the state of the programmable element can be read out toward the outside, for example, in a test operation. The trimming circuit, which is externally programmable, can then be adjusted in a manner dependent on the read-out state of the programmable element.

In accordance with an advantageous embodiment, this process is performed by a self-test unit for carrying out a test operation. In this case, the self-test unit automatically performs the evaluation of the electrical interconnect resistance of the programmable element and the setting of the operating point of the evaluation circuit in a manner dependent on the evaluation.

Other features which are considered as characteristic for the invention are set forth in the appended claims.

Although the invention is illustrated and described herein as embodied in a integrated circuit having a programmable element and method for operating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
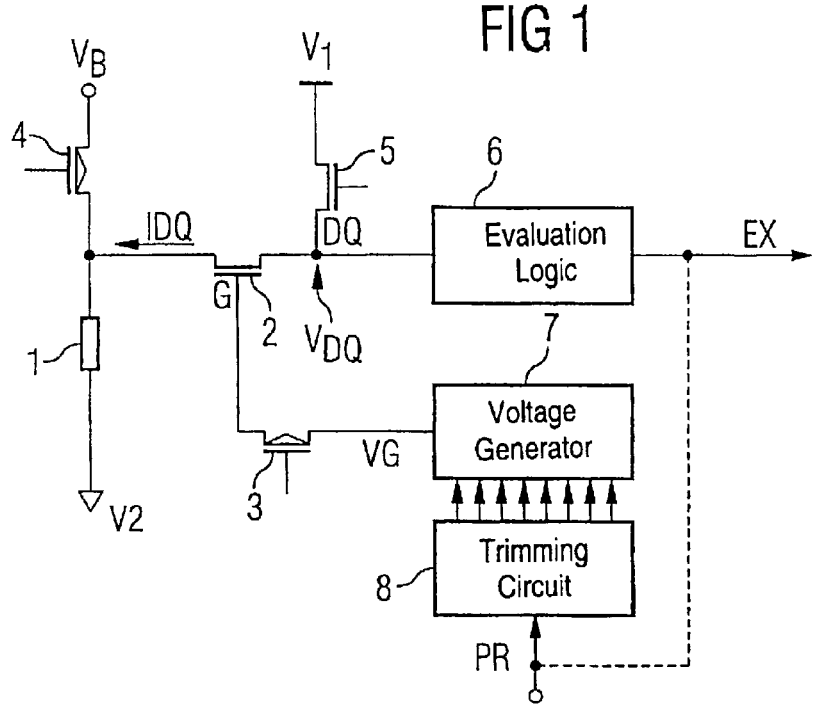
FIG. 1 is a schematic block circuit diagram showing an embodiment of an integrated circuit having a programmable element according to the invention.

Referring now to the figures of the drawing in detail and first, particularly, to FIG. 1 thereof, there is shown an embodiment of an integrated circuit having a programmable element 1 in the form of an electrically programmable antifuse. The antifuse 1 is connected to a transistor 4, which is put into a conducting state, in particular, for programming the antifuse 1. To that end, the transistor 4 is connected to a programming voltage VB (so-called burn voltage or blowing voltage), which assumes a comparatively high value relative to an operating voltage in normal operation of the integrated circuit. For its part, the antifuse 1 is connected to the supply voltage V2, ground in the example. The interconnect resistance of the antifuse 1 assumes a comparatively high value in the non-programmed state and a comparatively low value in the programmed state. For programming the antifuse 1, the transistor 4 is put into the conducting state, as a result of which a comparatively high current flows through the antifuse 1 and permanently varies the interconnect resistance thereof.

For reading out and evaluating the state of the antifuse 1, a read-out and evaluation circuit is provided, which has a read-out transistor 2 connected to the antifuse 1. Connected to that terminal of the read-out transistor 2 which is remote from the antifuse 1 is a high resistance in the form of the open-circuited transistor 5 (so-called bleeder), which, for its part, is connected to the internal supply voltage V1. This resistance 5 prevents, in particular, a floating state at the terminal DQ. Furthermore, an evaluation logic 6 is connected to the terminal DQ, which evaluation logic serves for evaluating the state of the antifuse 1 and stores a corresponding potential value VDQ.

The control terminal G of the read-out transistor 2 is connected to a voltage generator 7 via a transistor 3. The voltage generator 7 applies the control voltage VG to the control terminal G of the read-out transistor 2. A trimming circuit 8 is connected to the voltage generator 7 and serves for controlling the voltage generator 7, so that the control voltage VG can be set in a variable manner by the trimming circuit 8. With the variation of the control voltage VG, the operating point of the read-out transistor 2 can be set in a variable manner.

For the read-out of the antifuse, the read-out transistor 2 is put into a conducting state by application of a corresponding control voltage VG, so that a current IDQ flows between the supply voltages V1 and V2. The circuit comprising transistor 5, read-out transistor 2 and antifuse 1 forms a voltage divider at which VDQ is tapped off. The value of VDQ is dependent, in particular, on the respective interconnect resistance of the antifuse 1 and of the read-out transistor 2, where the latter can be influenced by the control voltage VG. If there are a multiplicity of programmable elements present in the integrated circuit, as is customary in practice, then the electrical interconnect resistances of the respective programmable elements may be subject to technologically dictated fluctuations in the production process. However, the variable setting of the operating range of the respective read-out transistor makes it possible to compensate for such fluctuations in so far as the evaluation logic connected to the read-out transistor receives potential values in a defined operating range.

Figure 4:
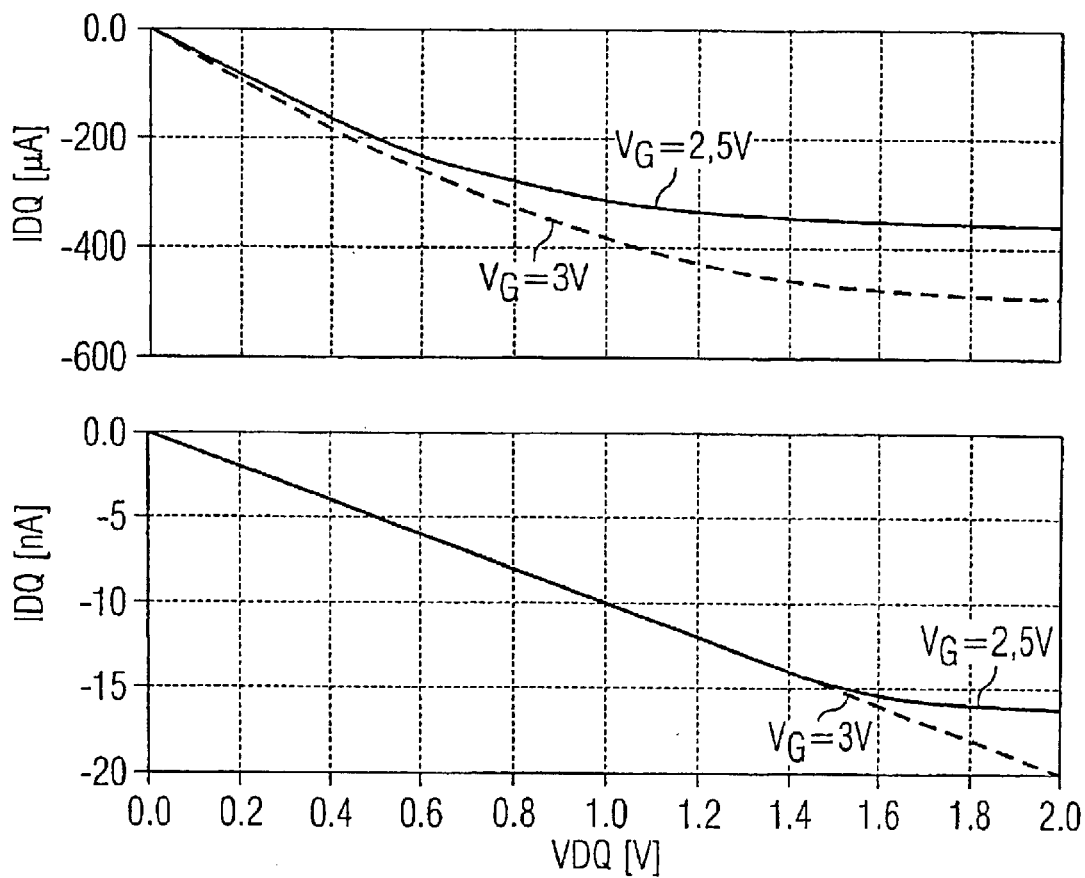
FIG. 4 are graphs plotting current-voltage diagrams of a programmable element in connection with a read-out transistor for different control voltages of the read-out transistor.

FIG. 4 shows exemplary current-voltage diagrams, the upper diagram showing the control behavior as a function of the control voltage VG of the read-out transistor for a programmed antifuse. The lower diagram shows the control behavior as a function of the control voltage VG of the read-out transistor 2 for a non-programmed antifuse.

As is further illustrated in FIG. 1, the evaluation logic 6 has an external terminal EX, via which the state of the antifuse 1 can be read out toward the outside. The trimming circuit 8 is externally programmable via a terminal PR. In a development of the invention which is advantageous in this respect, the evaluation logic 6 is embodied as a self-test unit which automatically performs the setting of the operating range of the read-out transistor 2 in a test operation of the integrated circuit. In this case, the evaluation logic 6 embodied as a self-test unit is internally connected directly to the trimming circuit 8, as illustrated by a broken line in FIG. 1.

Figure 2:
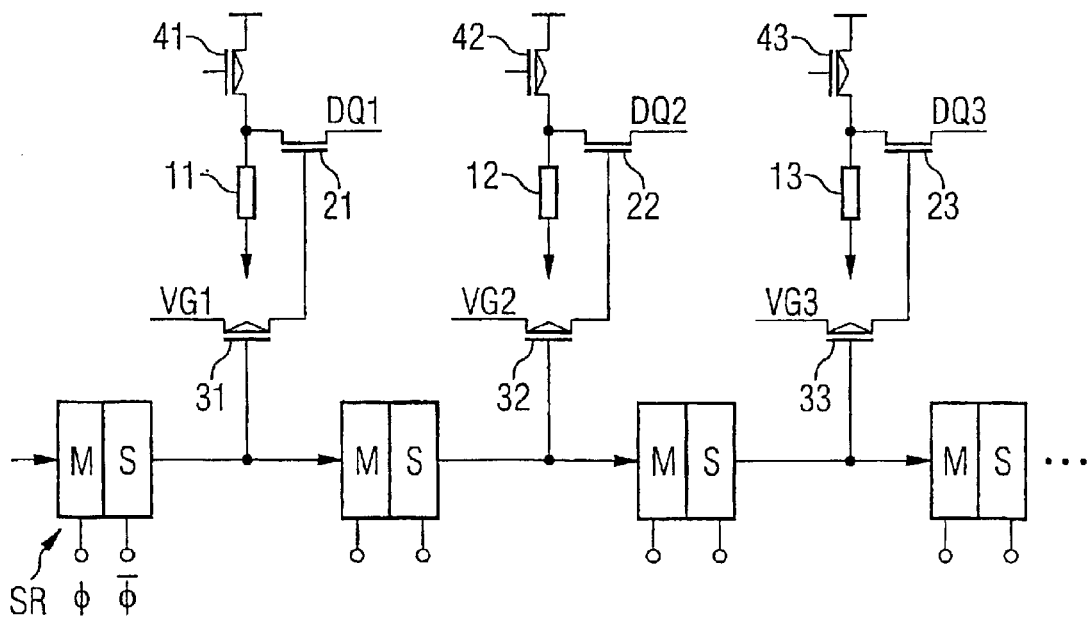
FIG. 2 is a schematic block circuit diagram of a circuit having a plurality of programmable elements which are addressed in a given way.

FIG. 2 shows a circuit arrangement wherein a plurality of fuse elements 11 to 13 are read out via respective read-out transistors 21 to 23 and evaluated. The respective terminals DQ1 to DQ3 are connected to a non-illustrated evaluation logic analogously to FIG. 1. The fuse elements 11 to 13 can be programmed via the transistors 41 to 43. The control voltages VG1 to VG3 are generated by a voltage generator in connection with a trimming circuit, analogously to FIG. 1. A respective read-out and evaluation process is initiated via the transistors 31 to 33. In this case, in accordance with FIG. 2, the fuse elements 11 to 13 are addressed by a shift register SR with respective master registers M and slave registers S. The shift process by the shift register SR is controlled by the control signals φ and /φ.

Figure 3:
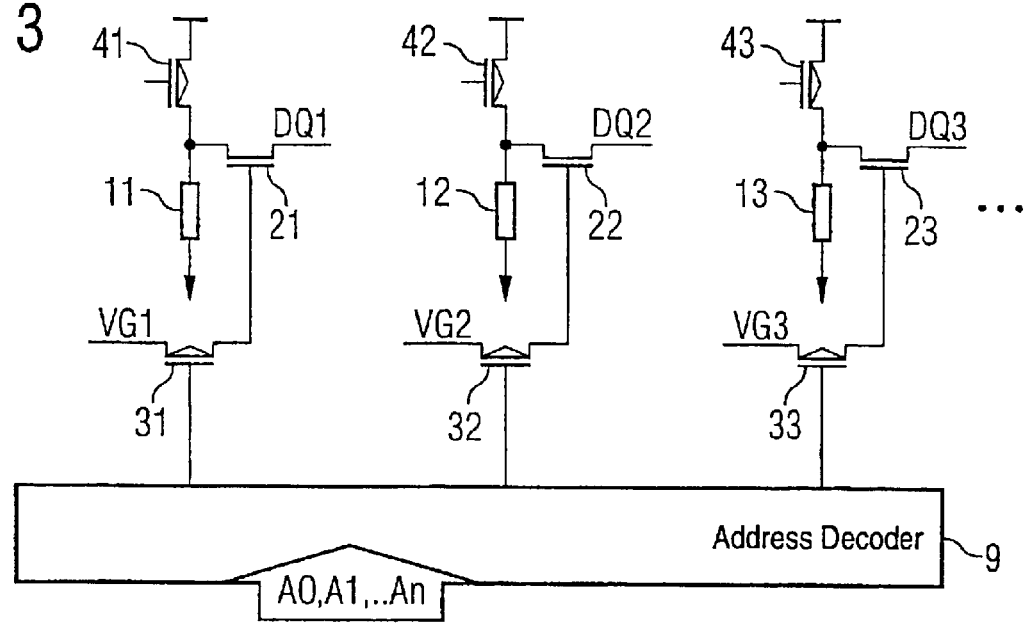
FIG. 3 is a schematic block circuit diagram of a circuit having a plurality of programmable elements which are addressed in another way.

FIG. 3 shows a circuit configuration similar to FIG. 2. Here, however, the fuse elements 11 to 13 are addressed by an address decoder 9. In this case, an address with the address bits A0, A1 to An is applied to the address decoder.

We claim:

1. An integrated circuit, comprising:
   a terminal for applying an internal voltage supply;
   a programmable element having an electrical interconnect resistance variable by programming;
   an evaluation circuit, connected to said programmable element, for evaluating the electrical interconnect resistance of said programmable element; and
   a trimming circuit, connected to said evaluation circuit, for variably generating a control voltage for variably setting an operating point of said evaluation circuit in an operation of the integrated circuit;
   said evaluation circuit having a reading-out transistor with a control terminal connected to said trimming circuit and receiving the control voltage;
   said terminal for applying the internal voltage supply being connected, through said reading-out transistor, to said programmable element.

2. The integrated circuit according to claim 1, which further comprises a voltage generator connected to said control terminal of said read-out transistor, and said trimming circuit is connected to control said voltage generator.

3. The integrated circuit according to claim 1, wherein said evaluation circuit has a terminal for read-out of the electrical interconnect resistance of said programmable element externally of said evaluation circuit, and said trimming circuit is an externally programmable circuit.

4. The integrated circuit according to claim 1, which further comprises a self-test unit for carrying out a test operation, for evaluating the electrical interconnect resistance of said programmable element in the test operation, and for setting the operating point of said evaluation circuit in dependence on a result of evaluating the electrical interconnect resistance.

5. A method of operating an integrated circuit, which comprises the following steps:
   providing an integrated circuit according to claim 1;
   reading out an electrical interconnect resistance of the programmable element and evaluating the electrical interconnect resistance with the evaluation circuit; and
   adjusting an operating point of the evaluation circuit with the trimming circuit in dependence on the electrical interconnect resistance obtained in the reading out step.

6. The method according to claim 5, which comprises setting, with the trimming circuit, a voltage value at a control terminal of a read-out transistor of the evaluation circuit, which is connected to the programmable element, in dependence on the electrical interconnect resistance read out in the reading out step.

* * * * *